United States Patent
Song et al.

(10) Patent No.: US 9,025,411 B2
(45) Date of Patent: May 5, 2015

(54) SEMICONDUCTOR MEMORY APPARATUS

(71) Applicant: SK Hynix Inc., Icheon-si Gyeonggi-do (KR)

(72) Inventors: Ji Seop Song, Icheon-si (KR); Chang Kyu Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 58 days.

(21) Appl. No.: 14/076,545

(22) Filed: Nov. 11, 2013

(65) Prior Publication Data
US 2015/0042388 A1  Feb. 12, 2015

(30) Foreign Application Priority Data
Aug. 9, 2013 (KR) .................. 10-2013-0094605

(51) Int. Cl.
*G11C 8/00* (2006.01)
*H03K 5/135* (2006.01)
(52) U.S. Cl.
CPC ...................................... *H03K 5/135* (2013.01)
(58) Field of Classification Search
CPC ...... G11C 7/1072; G11C 7/22; G11C 29/023; G11C 29/56012
USPC ................ 365/233.1, 233.11, 233.12, 226
See application file for complete search history.

(56) References Cited

U.S. PATENT DOCUMENTS

| 8,489,943 | B2 * | 7/2013 | Dwivedi et al. ............... 714/718 |
| 2007/0047337 | A1 * | 3/2007 | Iizuka ........................... 365/193 |
| 2013/0272454 | A1 * | 10/2013 | Watanabe et al. ............. 375/316 |

FOREIGN PATENT DOCUMENTS

| KR | 100837814 B1 | 6/2008 |
| KR | 100948069 B1 | 3/2010 |

* cited by examiner

*Primary Examiner* — Han Yang
(74) *Attorney, Agent, or Firm* — William Park & Associates Ltd.

(57) ABSTRACT

A semiconductor memory apparatus includes an enable signal generation unit configured to be inputted with a plurality of clocks which have different phases, and generate a plurality of enable signals; and a plurality of sampling units configured to output input data as sampling data in response to respective pairs of clocks of the plurality of clocks and respective ones of the plurality of enable signals.

20 Claims, 8 Drawing Sheets

SEMICONDUCTOR MEMORY APPARATUS

CROSS-REFERENCES TO RELATED APPLICATION

The present application claims priority under 35 U.S.C. §119(a) to Korean application number 10-2013-0094605, filed on Aug. 9, 2013, in the Korean Intellectual Property Office, which is incorporated herein by reference in its entirety.

BACKGROUND

1. Technical Field

Various embodiments relate to a semiconductor integrated circuit, and more particularly, to a semiconductor memory apparatus.

2. Related Art

A semiconductor memory apparatus is configured to receive data, store data, and output the stored data all in synchronization with a clock.

FIG. 1 shows a conventional semiconductor memory apparatus. The conventional semiconductor memory apparatus includes first to fourth sampling units 11, 12, 13 and 14, and a data output unit 20.

The first sampling unit 11 is inputted with a first clock CLK0, a second clock CLK1, and first input data D_in<0>. The first sampling unit 11 outputs the first input data D_in<0> as first sampling data D_p<0> when both the first clock CLK0 and the second clock CLK1 are low levels. The first clock CLK0 and the second clock CLK1 have a phase difference of ¼ cycle. The first sampling unit 11 includes first to fifth transistors P1, P2, N1, N2 and N3. The first transistor P1 has a gate to which a ground terminal VSS is electrically coupled, and a source which is applied with an external voltage VDD. The second transistor P2 has a gate which is inputted with the first input data D_in<0>, and a source to which the drain of the first transistor P1 is electrically coupled. The third transistor N1 has a gate which is inputted with the first clock CLK0, a drain which is electrically coupled to the drain of the second transistor P2, and a source which is electrically coupled to the ground terminal VSS. The fourth transistor N2 has a gate which is inputted with the second clock CLK1, a drain which is electrically coupled to the drain of the second transistor P2, and a source which is electrically coupled to the ground terminal VSS. The fifth transistor N3 has a gate which is inputted with the first input data D_in<0>, a drain which is electrically coupled to the drain of the second transistor P2, and a source to which is electrically coupled to the ground terminal VSS.

The second sampling unit 12 is inputted with the second clock CLK1, a third clock CLK2, and second input data D_in<1>. The second sampling unit 12 outputs the second input data D_in<1> as second sampling data D_p<1> when both the second clock CLK1 and the third clock CLK2 are low levels. The second clock CLK1 and the third clock CLK2 have a phase difference of ¼ cycle.

The third sampling unit 13 is inputted with the third clock CLK2, a fourth clock CLK3, and third input data D_in<2>. The third sampling unit 13 outputs the third input data D_in<2> as third sampling data D_p<2> when both the third clock CLK2 and the fourth clock CLK3 are low levels. The third clock CLK2 and the fourth clock CLK3 have a phase difference of ¼ cycle.

The fourth sampling unit 14 is inputted with the fourth clock CLK3, the first clock CLK0, and fourth input data D_in<3>. The fourth sampling unit 14 outputs the fourth input data D_in<3> as fourth sampling data D_p<3> when both the fourth clock CLK3 and the first clock CLK0 are low levels. The fourth clock CLK3 and the first clock CLK0 have a phase difference of ¼ cycle. The second to fourth sampling units 12, 13 and 14 are configured in substantially the same way as the first sampling unit 11 except that signals to be inputted thereto and outputted therefrom are different.

The data output unit 20 outputs the first to fourth sampling is data D_p<0:3> as serial data D_serial.

Operations of the conventional semiconductor memory apparatus will be described below with reference to FIGS. 1 and 2.

The first to fourth clocks CLK0 to CLK3 have a phase difference of ¼ cycle with one another.

During a period in which both the first clock CLK0 and the second clock CLK1 are low levels, the first sampling data D_p<0> is outputted as the serial data D_serial.

During a period in which both the second clock CLK1 and the third clock CLK2 are low levels, the second sampling data D_p<1> is outputted as the serial data D_serial.

During a period in which both the third clock CLK2 and the fourth clock CLK3 are low levels, the third sampling data D_p<2> is outputted as the serial data D_serial.

During a period in which both the fourth clock CLK3 and the first clock CLK0 are low levels, the fourth sampling data D_p<3> is outputted as the serial data D_serial.

The conventional semiconductor memory apparatus operating in this way has substantial power consumption. For example, the first sampling unit 11 outputs the first sampling data D_p<0> during a period in which both the first clock CLK0 and the second clock CLK1 are low levels. To put it in another way, the first sampling unit 11 does not output the first sampling data D_p<0> when any one of the first clock CLK0 and the second clock CLK1 is a high level. In spite of not outputting the first sampling data D_p<0>, that is, not performing an operation, in the first sampling unit 11, the third and fourth transistors N1 and N2 are turned on when any one of the first clock CLK0 and the second clock CLK1 is a high level. At this time, if the level of the first input data D_in<0> is a low level, current flowing in through the first and second transistors P1 and P2 flows out to the ground terminal VSS through the third and fourth transistors N1 and N2.

Since the second to fourth sampling units 12 to 14 are configured in the same way as the first sampling unit 11, they also consume current even while they do not operate.

Such a problem should be solved to realize a semiconductor memory apparatus with low power consumption.

SUMMARY

A semiconductor memory apparatus with low power consumption is described herein.

In an embodiment of the present invention, a semiconductor memory apparatus includes: an enable signal generation unit configured to be inputted with a plurality of clocks which have different phases, and generate a plurality of enable signals; and a plurality of sampling units configured to output input data as sampling data in response to respective pairs of clocks of the plurality of clocks and respective ones of the plurality of enable signals.

In an embodiment of the present invention, a semiconductor memory apparatus includes: a first sampling unit configured to output first input data as first sampling data in response to a first enable signal, a first clock, and a second clock; a second sampling unit configured to output second input data as second sampling data in response to a second enable signal, the second clock, and a third clock; a third sampling unit configured to output third input data as third sampling data in response to a third enable signal, the third clock, and a fourth clock; a fourth sampling unit configured to output fourth input data as fourth sampling data in response to a fourth enable signal, the fourth clock, and the first clock; and an enable signal generation unit configured to generate the first to fourth enable signals in response to the first to fourth clocks, wherein the second clock has a phase later by ¼ cycle than a phase of the first clock, the third clock has a phase later by ¼ cycle than the phase of the second clock, and the fourth clock has a phase later by ¼ cycle than the phase of the third clock.

Accordingly, a semiconductor memory apparatus of the present disclosure may reduce power consumption in sampling data.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through example embodiments.

Figure 3:
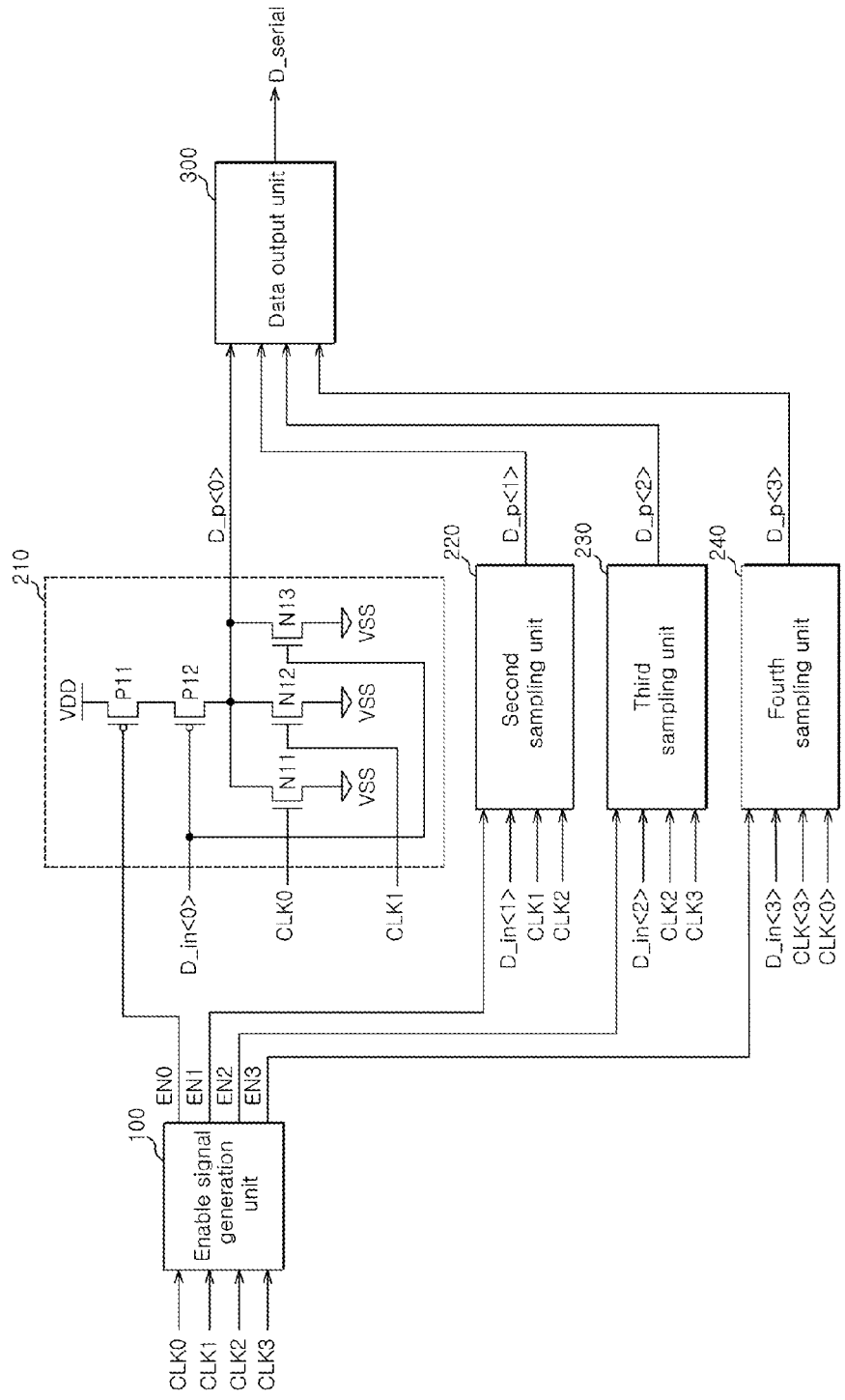
FIG. 3 illustrates a configuration diagram of a semiconductor memory apparatus in accordance with an embodiment of the present disclosure.

Referring to FIG. 3, a semiconductor memory apparatus in accordance with an embodiment of the present disclosure includes an enable signal generation unit 100, first to fourth sampling units 210, 220, 230 and 240, and a data output unit 300.

The enable signal generation unit 100 is configured to receive first to fourth clocks CLK0, CLK1, CLK2 and CLK3 and generate first to fourth enable signals EN0, EN1, EN2 and EN3.

The respective first to fourth sampling units 210, 220, 230 and 240 are configured to output input data D_in<0>, D_in<1>, D_in<2> and D_in<3> inputted thereto, as sampling data D_p<0>, D_p<1>, D_p<2> and D_p<3> in response to respective pairs of clocks CLK0 and CLK1, CLK1 and CLK2, CLK2 and CLK3, and CLK3 and CLK0 of the first to fourth clocks CLK0, CLK1, CLK2 and CLK3 and the respective first to fourth enable signals EN0, EN1, EN2 and EN3. For instance, the first sampling unit 210 outputs the first input data D_in<0> as the first sampling data D_p<0> in response to the first and second clocks CLK0 and CLK1 and the first enable signal EN0. The second sampling unit 220 outputs the second input data D_in<1> as the second sampling data D_p<1> in response to the second and third clocks CLK1 and CLK2 and the second enable signal EN1. The third sampling unit 230 outputs the third input data D_in<2> as the third sampling data D_p<2> in response to the third and fourth clocks CLK2 and CLK3 and the third enable signal EN2. The fourth sampling unit 240 outputs the fourth input data D_in<3> as the fourth sampling data D_p<3> in response to the fourth and first clocks CLK3 and CLK0 and the fourth enable signal EN3.

Because all of the first to fourth sampling units 210, 220, 230 and 240 are configured in substantially the same way except that signals to be inputted thereto and outputted therefrom are different, only the configuration of the first sampling unit 210 will be described below.

The first sampling unit 210 includes first to fifth transistors P11, P12, N11, N12 and N13. The first transistor P11 has a gate which is inputted with the first enable signal EN0, and a source which is applied with an external voltage VDD. The second transistor P12 has a gate which is inputted with the first input data D_in<0>, and a source which is electrically coupled to the drain of the first transistor P11. The third transistor N11 has a gate which is inputted with the first clock CLK0, a drain which is electrically coupled to the drain of the second transistor P12, and a source which is electrically coupled to a ground terminal VSS. The fourth transistor N12 has a gate which is inputted with the second clock CLK1, a drain which is electrically coupled to the drain of the second transistor P12, and a source which is electrically coupled to the ground terminal VSS. The fifth transistor N13 has a gate which is inputted with the first input data D_in<0>, a drain which is electrically coupled to the drain of the second transistor P12, and a source which is electrically coupled to the ground terminal VSS.

The first sampling unit 210 configured in this way outputs the first input data D_in<0> as the first sampling data D_p<0> during a period in which the first enable signal EN0 is enabled to a low level and both the both the first and second clocks CLK0 and CLK1 are low levels.

The second sampling unit 220 outputs the second input data D_in<1> as the second sampling data D_p<1> during a period in which the second enable signal EN1 is enabled to a low level and both the second and third clocks CLK1 and CLK2 are low levels.

The third sampling unit 230 outputs the third input data D_in<2> as the third sampling data D_p<2> during a period in which the third enable signal EN2 is enabled to a low level and both the third and fourth clocks CLK2 and CLK3 are low levels.

The fourth sampling unit 240 outputs the fourth input data D_in<3> as the fourth sampling data D_p<3> during a period in which the fourth enable signal EN3 is enabled to a low level and both the fourth and first clocks CLK3 and CLK0 are low levels.

The respective first to fourth sampling units 210, 220, 230 and 240 are activated during the enable periods of the enable signals EN0 to EN3 respectively inputted thereto. When activated, the respective first to fourth sampling units 210, 220, 230 and 240 output the input data D_in<0:3> inputted thereto, as the sampling data D_p<0:3> when the respective pairs of clocks CLK0 and CLK1, CLK1 and CLK2, CLK2 and CLK3, and CLK3 and CLK0 inputted thereto are all low levels.

The data output unit 300 is configured to output the first to fourth sampling data D_p<0:3> as serial data D_serial.

Figure 4:
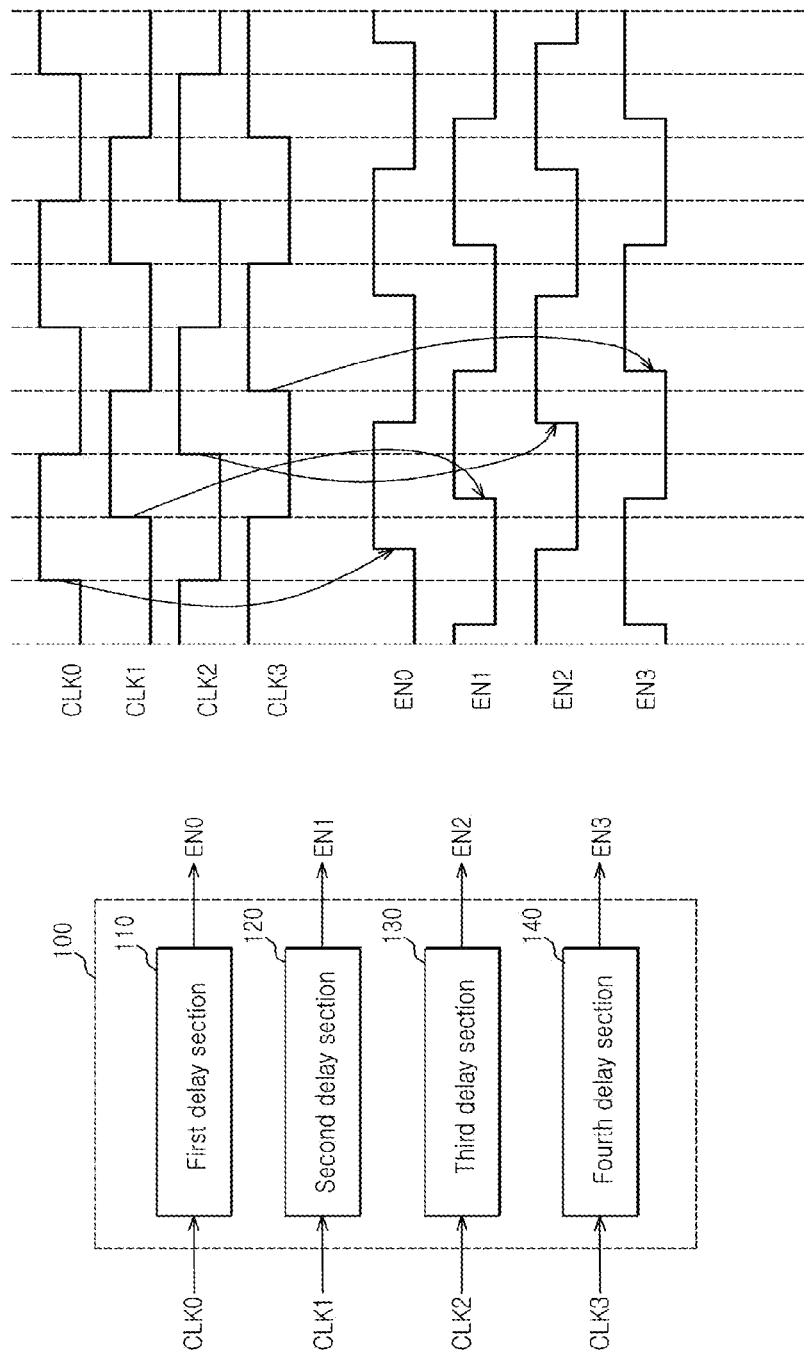
FIG. 4 illustrates a configuration diagram and a timing diagram of an example embodiment of the enable signal generation unit shown in FIG. 3.

Referring to FIG. 4, the enable signal generation unit 100 includes first to fourth delay sections 110, 120, 130 and 140.

The first delay section 110 is configured to delay the first clock CLK0 and generate the first enable signal EN0. The delay time of the first delay section 110 is set such that a period in which both the first clock CLK0 and the second clock CLK1 are low levels overlaps with the enable period of the first enable signal EN0. That is to say, the delay time of the first delay section 110 is achieved by delaying the first clock CLK0 such that the low level period of the first clock CLK0—that is, the enable period of the first enable signal EN0—overlaps with the period in which both the first clock CLK0 and the second clock CLK1 are low levels. For example, the first enable signal EN0 may be generated by delaying the first clock CLK0 for ⅛ cycle, and the delay time of the first delay section 110 is a time corresponding to ⅛ clock cycle.

The second delay section 120 is configured to delay the second clock CLK1 and generate the second enable signal EN1. The delay time of the second delay section 120 is set such that a period in which both the second clock CLK1 and the third clock CLK2 are low levels overlaps with the enable period of the second enable signal EN1. That is to say, the delay time of the second delay section 120 is achieved by delaying the second clock CLK1 such that the low level period of the second clock CLK1—that is, the enable period of the second enable signal EN1—overlaps with the period in which both the second clock CLK1 and the third clock CLK2 are low levels. For example, the second enable signal EN1 may be generated by delaying the second clock CLK1 for ⅛ cycle, and the delay time of the second delay section 120 is a time corresponding to ⅛ clock cycle.

The third delay section 130 is configured to delay the third clock CLK2 and generate the third enable signal EN2. The delay time of the third delay section 130 is set such that a period in which both the third clock CLK2 and the fourth clock CLK3 are low levels overlaps with the enable period of the third enable signal EN2. That is to say, the delay time of the third delay section 130 is achieved by delaying the third clock CLK2 such that the low level period of the third clock CLK2—that is, the enable period of the third enable signal EN2—overlaps with the period in which both the third clock CLK2 and the fourth clock CLK3 are low levels. For example, the third enable signal EN2 may be generated by delaying the third clock CLK2 for ⅛ cycle, and the delay time of the third delay section 130 is a time corresponding to ⅛ clock cycle.

The fourth delay section 140 is configured to delay the fourth clock CLK3 and generate the fourth enable signal EN3. The delay time of the fourth delay section 140 is set such that a period in which both the fourth clock CLK3 and the first clock CLK0 are low levels overlaps with the enable period of the fourth enable signal EN3. That is to say, the delay time of the fourth delay section 140 is achieved by delaying the fourth clock CLK3 such that the low level period of the fourth clock CLK3—that is, the enable period of the fourth enable signal EN3—overlaps with the period in which both the fourth clock CLK3 and the first clock CLK0 are low levels. For example, the fourth enable signal EN3 may be generated by delaying the fourth clock CLK3 for ⅛ cycle, and the delay time of the fourth delay section 140 is a time corresponding to ⅛ clock cycle.

The semiconductor memory apparatus in accordance with an embodiment of the present disclosure, configured in this way, operates as follows.

The first sampling unit 210 is activated during the enable period of the first enable signal EN0, and outputs the first input data D_in<0> as the first sampling data D_p<0> when both the first clock CLK0 and the second clock CLK1 are low levels.

The second sampling unit 220 is activated during the enable period of the second enable signal EN1, and outputs the second input data D_in<1> as the second sampling data D_p<1> when both the second clock CLK1 and the third clock CLK2 are low levels.

The third sampling unit 230 is activated during the enable period of the third enable signal EN2, and outputs the third input data D_in<2> as the third sampling data D_p<2> when the third clock CLK2 and the fourth clock CLK3 are low levels.

The fourth sampling unit 240 is activated during the enable period of the fourth enable signal EN3, and outputs the fourth input data D_in<3> as the fourth sampling data D_p<3> when both the fourth clock CLK3 and the first clock CLK0 are low levels.

Figure 1:
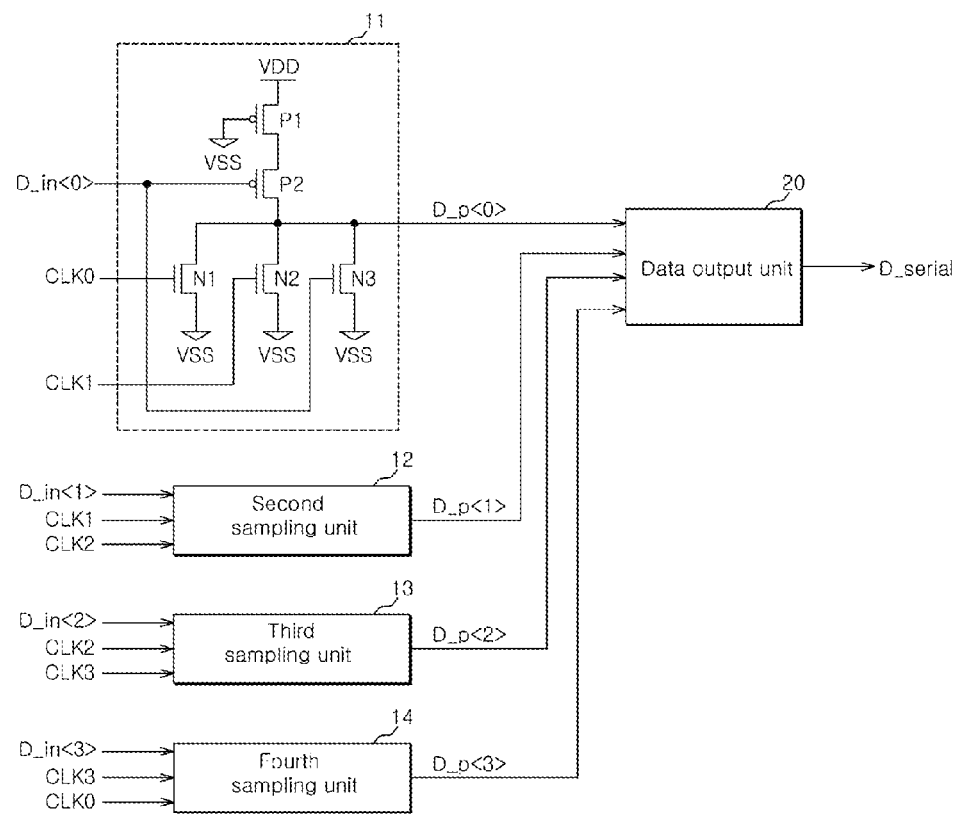
FIG. 1 illustrates a configuration diagram of a conventional semiconductor memory apparatus.
Figure 2:
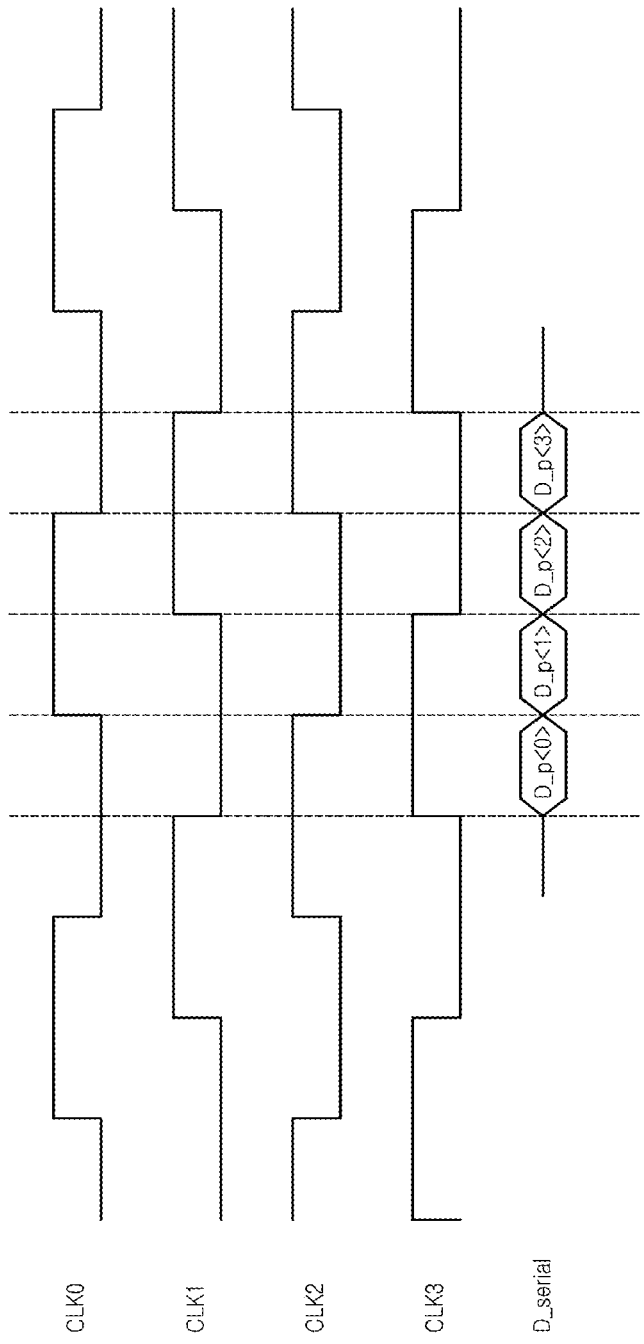
FIG. 2 illustrates a timing diagram explaining the conventional semiconductor memory apparatus.

The first to fourth sampling units 210 to 240 are activated and consume current only during the enable periods of the first to fourth enable signals EN0 to EN3. In the conventional semiconductor memory apparatus shown in FIG. 1, the first to fourth sampling units 110, 120, 130 and 140 are constantly activated and, thus, constantly consume current. Therefore, the semiconductor memory apparatus in accordance with an embodiment of the present disclosure has a reduced current consumption while still performing the same operations as the conventional semiconductor memory apparatus.

Figure 5:
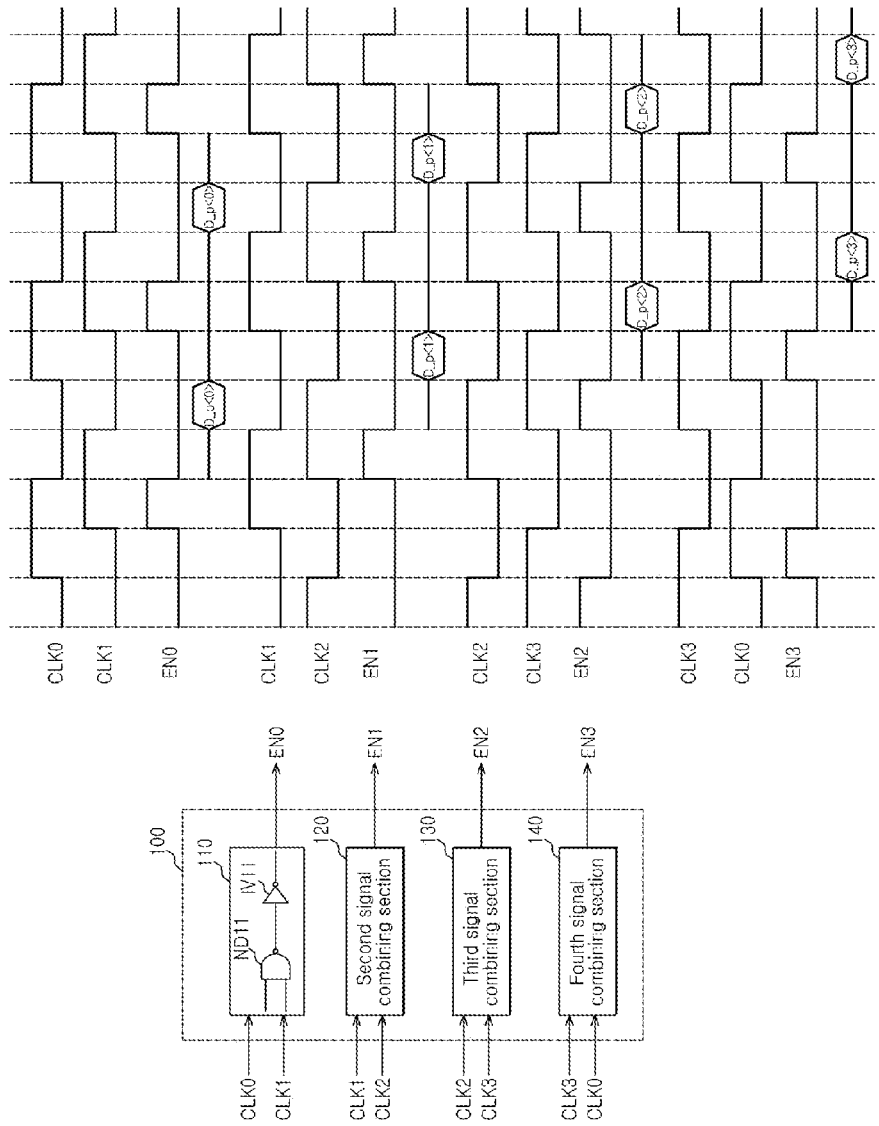
FIG. 5 illustrates a configuration diagram and a timing diagram of another example embodiment of the enable signal generation unit shown in FIG. 3.

The enable signal generation unit 100 of FIG. 3 may be configured as shown in FIG. 5.

The enable signal generation unit 100 shown in FIG. 5 includes first to fourth signal combining sections 110, 120, 130 and 140.

The first signal combining section 110 is configured to be inputted with the first clock CLK0 and the second clock CLK1 and generate the first enable signal EN0. For example, the first signal combining section 110 generates the first enable signal EN0 which has an enable period that overlaps with periods in which the first clock CLK0 and the second clock CLK1 are low levels. In other words, the first signal combining section 110 generates the first enable signal EN0 which is enabled during a period excluding a period in which both the first clock CLK0 and the second clock CLK1 are high levels. Namely, the first signal combing section 110 generates the first enable signal EN0 by ANDing the first clock CLK0 and the second clock CLK1.

The second signal combining section 120 is configured to be inputted with the second clock CLK1 and the third clock CLK2 and generate the second enable signal EN1. For example, the second signal combining section 120 generates the second enable signal EN1 which has an enable period that overlaps with periods in which the second clock CLK1 and the third clock CLK2 are low levels. In other words, the second signal combining section 120 generates the second enable signal EN1 which is enabled during a period excluding a period in which both the second clock CLK1 and the third clock CLK1 are high levels. Namely, the second signal combing section 120 generates the second enable signal EN1 by ANDing the second clock CLK1 and the third clock CLK2.

The third signal combining section 130 is configured to be inputted with the third clock CLK2 and the fourth clock CLK3 and generate the third enable signal EN2. For example, the third signal combining section 130 generates the third enable signal EN2 which has an enable period that overlaps with periods in which the third clock CLK2 and the fourth clock CLK3 are low levels. In other words, the third signal combining section 130 generates the third enable signal EN2 which is enabled during a period excluding a period in which both the third clock CLK2 and the fourth clock CLK3 are high levels. Namely, the third signal combing section 130 generates the third enable signal EN2 by ANDing the third clock CLK2 and the fourth clock CLK3.

The fourth signal combining section 140 is configured to be inputted with the fourth clock CLK3 and the first clock CLK0 and generate the fourth enable signal EN3. For example, the fourth signal combining section 140 generates the fourth enable signal EN3 which has an enable period that overlaps with periods in which the fourth clock CLK3 and the first clock CLK0 are low levels. In other words, the fourth signal combining section 140 generates the fourth enable signal EN3 which is enabled during a period excluding a period in which both the fourth clock CLK3 and the first clock CLK0 are high levels. Namely, the fourth signal combing section 140 generates the fourth enable signal EN3 by ANDing the fourth clock CLK3 and the first clock CLK0.

Because the first to fourth signal combining sections 110 to 140 are configured in substantially the same way except that signals to be inputted thereto and outputted therefrom are different, only a configuration of the first signal combining section 110 will be described below.

The first signal combining section 110 includes a NAND gate ND11 and an inverter IV11. The NAND gate ND11 is inputted with the first and second clocks CLK0 and CLK1. The inverter IV11 is inputted with the output signal of the NAND gate ND11, and outputs the first enable signal EN0.

The semiconductor memory apparatus in accordance with the embodiment of the present disclosure, configured as described above, operates as follows when assuming that the enable signal generation unit 100 configured as in FIG. 5 is used as the enable signal generation unit 100 of FIG. 3.

The first sampling unit 210 is activated during the enable period of the first enable signal EN0, and outputs the first input data D_in<0> as the first sampling data D_p<0> when both the first clock CLK0 and the second clock CLK1 are low levels.

The second sampling unit 220 is activated during the enable period of the second enable signal EN1, and outputs the second input data D_in<1> as the second sampling data D_p<1> when both the second clock CLK1 and the third clock CLK2 are low levels.

The third sampling unit 230 is activated during the enable period of the third enable signal EN2, and outputs the third input data D_in<2> as the third sampling data D_p<2> when both the third clock CLK2 and the fourth clock CLK3 are low levels.

The fourth sampling unit 240 is activated during the enable period of the fourth enable signal EN3, and outputs the fourth input data D_in<3> as the fourth sampling data D_p<3> when both the fourth clock CLK3 and the first clock CLK0 are low levels.

The first to fourth sampling units 210 to 240 are activated and consume current during only the enable periods of the first to fourth enable signals EN0 to EN3. In the conventional semiconductor memory apparatus shown in FIG. 1, the first to fourth sampling units 110, 120, 130 and 140 are constantly activated and, thus, constantly consume current. Therefore, the semiconductor memory apparatus in accordance with an embodiment of the present disclosure has reduced current consumption while performing the same operations as the conventional semiconductor memory apparatus.

Figure 6:
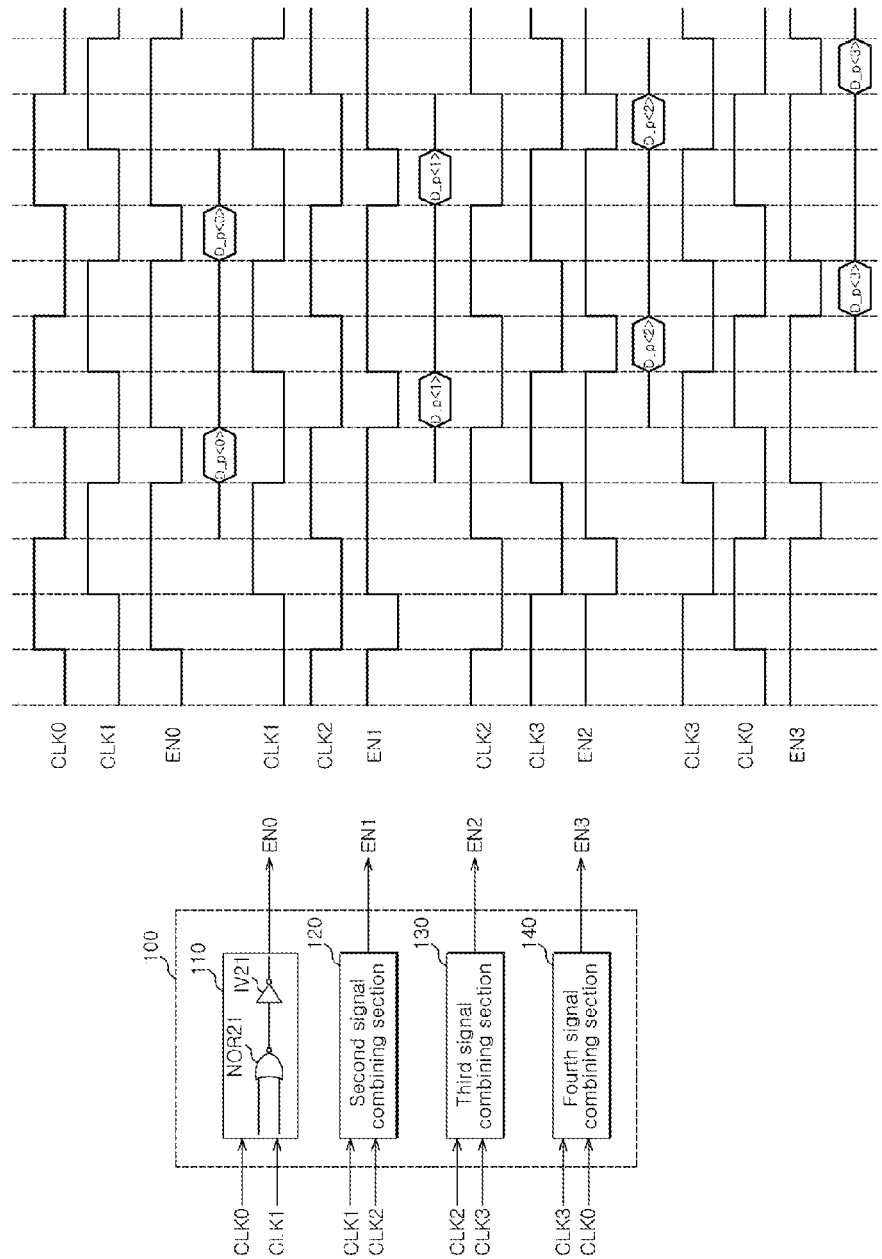
FIG. 6 illustrates a configuration diagram and a timing diagram of an example embodiment of the enable signal generation unit shown in FIG. 3.

The enable signal generation unit 100 of FIG. 3 may be configured as shown in FIG. 6.

The enable signal generation unit 100 shown in FIG. 6 includes first to fourth signal combining sections 110, 120, 130 and 140.

The first signal combining section 110 is configured to be inputted with the first clock CLK0 and the second clock CLK1 and generate the first enable signal EN0. For example, the first signal combining section 110 generates the first enable signal EN0 which has an enable period that overlaps with a period in which both the first clock CLK0 and the second clock CLK1 are low levels. In other words, the first signal combining section 110 generates the first enable signal EN0 which is enabled during the period in which both the first clock CLK0 and the second clock CLK1 are low levels, that is, during a period excluding periods in which either of the first clock CLK0 and the second clock CLK1 is a high level. Namely, the first signal combing section 110 generates the first enable signal EN0 by ORing the first clock CLK0 and the second clock CLK1.

The second signal combining section 120 is configured to be inputted with the second clock CLK1 and the third clock CLK2 and generate the second enable signal EN1. For example, the second signal combining section 120 generates the second enable signal EN1 which has an enable period that overlaps with a period in which both the second clock CLK1 and the third clock CLK2 are low levels. In other words, the second signal combining section 120 generates the second enable signal EN1 which is enabled during the period in which both the second clock CLK1 and the third clock CLK2 are low levels, that is, during a period excluding periods in which either of the second clock CLK1 and the third clock CLK2 is a high level. Namely, the second signal combing section 120 generates the second enable signal EN1 by ORing the second clock CLK1 and the third clock CLK2.

The third signal combining section 130 is configured to be inputted with the third clock CLK2 and the fourth clock CLK3 and generate the third enable signal EN2. For example, the third signal combining section 130 generates the third enable signal EN2 which has an enable period that overlaps with a period in which both the third clock CLK2 and the fourth clock CLK3 are low levels. In other words, the third signal combining section 130 generates the third enable signal EN2 which is enabled during the period in which both the third clock CLK2 and the fourth clock CLK3 are low levels, that is, during a period excluding periods in which either of the third clock CLK2 and the fourth clock CLK3 is a high level. Namely, the third signal combing section 130 generates the third enable signal EN2 by ORing the third clock CLK2 and the fourth clock CLK3.

The fourth signal combining section 140 is configured to be inputted with the fourth clock CLK3 and the first clock CLK0 and generate the fourth enable signal EN3. For example, the fourth signal combining section 140 generates the fourth enable signal EN3 which has an enable period that overlaps with a period in which both the fourth clock CLK3 and the first clock CLK0 are low levels. In other words, the fourth signal combining section 140 generates the fourth enable signal EN3 which is enabled during the period in which both the fourth clock CLK3 and the first clock CLK0 are low levels, that is, during a period excluding periods in which either of the fourth clock CLK3 and the first clock CLK0 is a high level. Namely, the fourth signal combing section 140 generates the fourth enable signal EN3 by ORing the fourth clock CLK3 and the first clock CLK0.

Because the first to fourth signal combining sections 110 to 140 are configured in substantially the same way except that signals to be inputted thereto and outputted therefrom are different, only a configuration of the first signal combining section 110 will be described below.

The first signal combining section 110 includes a NOR gate NOR21 and an inverter IV21. The NOR gate NOR21 is inputted with the first and second clocks CLK0 and CLK1. The inverter IV21 is inputted with the output signal of the NOR gate NOR21, and outputs the first enable signal EN0.

The semiconductor memory apparatus in accordance with an embodiment of the present disclosure, configured as described above, operates as follows when assuming that the enable signal generation unit 100 configured as in FIG. 6 is used as the enable signal generation unit 100 of FIG. 3.

The first sampling unit 210 is activated during the enable period of the first enable signal EN0, and outputs the first input data D_in<0> as the first sampling data D_p<0> when both the first clock CLK0 and the second clock CLK1 are low levels.

The second sampling unit 220 is activated during the enable period of the second enable signal EN1, and outputs the second input data D_in<1> as the second sampling data D_p<1> when both the second clock CLK1 and the third clock CLK2 are low levels.

The third sampling unit 230 is activated during the enable period of the third enable signal EN2, and outputs the third input data D_in<2> as the third sampling data D_p<2> when both the third clock CLK2 and the fourth clock CLK3 are low levels.

The fourth sampling unit 240 is activated during the enable period of the fourth enable signal EN3, and outputs the fourth input data D_in<3> as the fourth sampling data D_p<3> when both the fourth clock CLK3 and the first clock CLK0 are low levels.

The first to fourth sampling units 210 to 240 are activated and consume current during only the enable periods of the first to fourth enable signals EN0 to EN3. In the conventional semiconductor memory apparatus shown in FIG. 1, the first to fourth sampling units 110, 120, 130 and 140 are constantly activated and, thus, constantly consume current. Therefore, the semiconductor memory apparatus in accordance with an embodiment of the present disclosure has reduced current consumption while performing the same operations as the conventional semiconductor memory apparatus.

Figure 7:
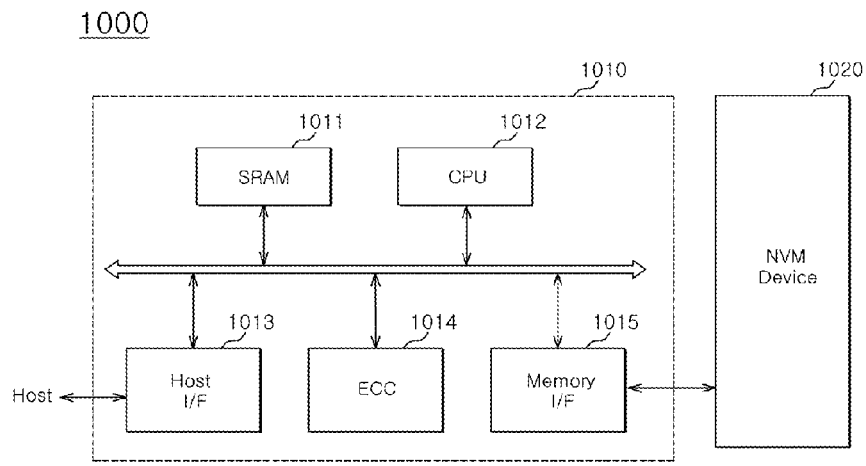
FIG. 7 is a schematic block diagram of a memory system according to an embodiment of the present disclosure.

Referring to FIG. 7, a memory system 1000 according to an embodiment of the present disclosure may include a non-volatile memory device 1020 and a memory controller 1010.

The non-volatile memory device 1020 may be configured to include the above-described semiconductor memory device. The memory controller 1010 may be configured to control the non-volatile memory device 1020 in a general operation mode such as a program loop, a read operation or an erase loop.

The memory system 1000 may be a solid state disk (SSD) or a memory card in which the memory device 1020 and the memory controller 1010 are combined. SRAM 1011 may function as an operation memory of a processing unit (CPU) 1012. A host interface 1013 may include a data exchange protocol of a host being coupled to the memory system 1100. An error correction code (ECC) block 1014 may detect and correct errors included in a data read from the non-volatile memory device 1020. A memory interface (I/F) 1015 may interface with the non-volatile memory device 1020. The CPU 1012 may perform the general control operation for data exchange of the memory controller 1010.

Though not illustrated in FIG. 7, the memory system 1100 may further include ROM that stores code data to interface with the host. In addition, the non-volatile memory device 1020 may be a multi-chip package composed of a plurality of flash memory chips. The memory system 1000 may be provided as a storage medium with a low error rate and high reliability. A memory system 1000 such as a Solid State Disk (SSD), on which research has been actively carried out, may include a flash memory device according to an embodiment of the present disclosure. In this case, the memory controller 1010 may be configured to communicate with the outside (e.g., a host) through one of the interface protocols including USB, MMC, PCI-E, SATA, PATA, SCSI, ESDI and IDE.

Figure 8:
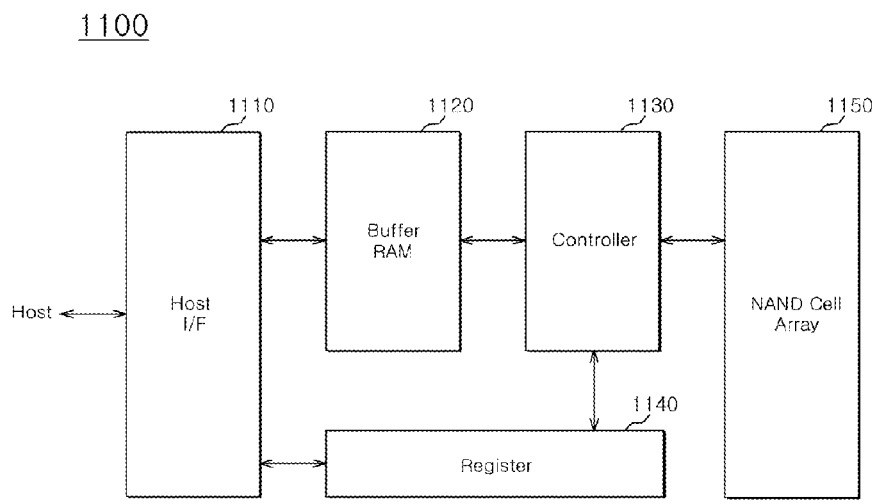
FIG. 8 is a schematic block diagram of a fusion memory device or a fusion memory system configured to perform a program operation according to the aforementioned various embodiments.

Referring to FIG. 8, a OneNAND flash memory device 1100 may include a host interface (I/F) 1110, a buffer RAM 1120, a controller 1130, a register 1140 and a NAND flash cell array 1150. The OneNAND flash memory device 1100 may be used in a fusion memory device.

The host interface 1110 may be configured to exchange various types of information with a device through a different protocol. The buffer RAM 1120 may have built-in codes for driving the memory device or temporarily store data. The controller 1130 may be configured to control read and program operations and every state in response to a control signal and a command that are externally provided. The register 1140 may be configured to store data including instructions, addresses and configurations defining a system operating environment in the memory device. The NAND flash cell array 1150 may be formed of operation circuits including non-volatile memory cells and page buffers.

Figure 9:
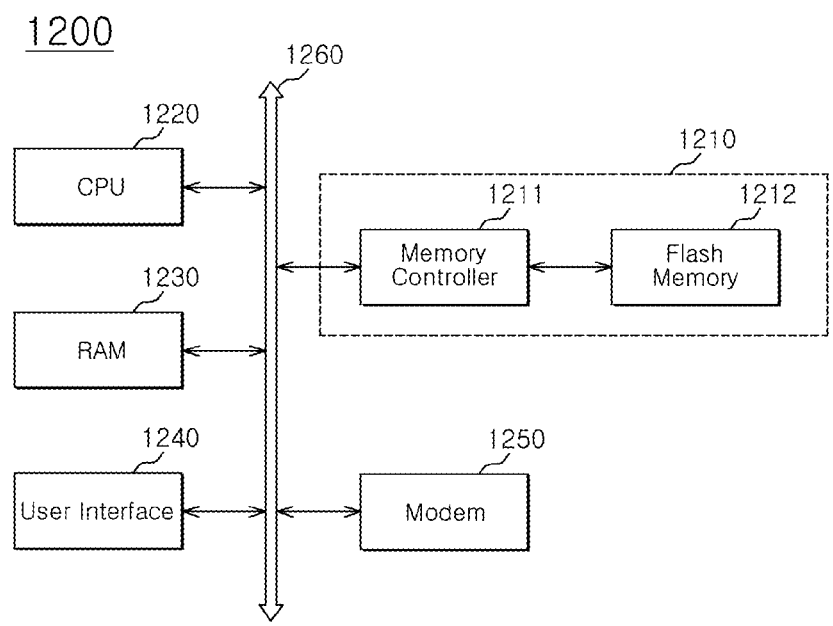
FIG. 9 is a schematic block diagram of a computing system including a flash memory device according to an embodiment of the present disclosure.

Referring to FIG. 9, a computing system 1200 may include a microprocessor (CPU) 1220, RAM 1230, a user interface 1240, a modem 1250, such as a baseband chipset, and a memory system 1210 that are electrically coupled to a system bus 1260. In addition, if the computing system 1300 is a mobile device, then a battery (not illustrated) may be additionally provided to apply an operating voltage to the computing system 1200. Though not illustrated in FIG. 9, the computing system 1200 may further include application chipsets, a Camera Image Processor (CIS), or mobile DRAM. The memory system 1210 may include a flash memory device 1212 according to the above embodiments. That is, the memory system 1210 may form a Solid State Drive/Disk (SSD) that uses a non-volatile memory to store data. The memory system 1310 may be provided as a fusion flash memory (e.g., OneNAND flash memory).

While certain embodiments have been described above, it will be understood by those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
an enable signal generation unit configured to be inputted with a plurality of clocks which have different phases, and generate a plurality of enable signals; and
a plurality of sampling units configured to output input data as sampling data in response to respective pairs of clocks of the plurality of clocks and respective ones of the plurality of enable signals.

2. The semiconductor memory apparatus according to claim 1, wherein the enable signal generation unit comprises delay sections configured to respectively delay the plurality of clocks and respectively output the plurality of enable signals.

3. The semiconductor memory apparatus according to claim 2, wherein each of the delay sections are configured to be inputted with a pair of clocks from among the plurality of clocks, and delay at least one of the inputted pair of clocks, and output an enable signal with an enable period that overlaps with a period in which the pair of clocks are a specified level.

4. The semiconductor memory apparatus according to claim 1,
wherein the enable signal generation unit comprises signal combining sections configured to respectively generate the plurality of enable signals, and
wherein each of the signal combining sections are configured to be input with a pair of clocks from among the plurality of clocks, and generate a corresponding enable signal having an enable period that overlaps with a period in which both of the pair of clocks are a specified level.

5. The semiconductor memory apparatus according to claim 4, wherein each of the signal combining sections generates a corresponding enable signal having an enable period that excludes a period in which both of the pair of clocks are a high level.

6. The semiconductor memory apparatus according to claim 5, wherein each of the signal combining sections generates a corresponding enable signal by ANDing the pair clocks.

7. The semiconductor memory apparatus according to claim 4, wherein each of the signal combining sections generates a corresponding enable signal that is not enabled when either of the pair of clocks is a specified level.

8. The semiconductor memory apparatus according to claim 7, wherein each of the signal combining sections generates a corresponding enable signal by ORing the pair of clocks.

9. The semiconductor memory apparatus according to claim 1, wherein each of the plurality of sampling units is activated during an enable period of an enable signal inputted thereto, and outputs input data as sampling data during a period in which both of a pair of clocks corresponding to each of the plurality of sampling units are a low level.

10. A semiconductor memory apparatus comprising:
a first sampling unit configured to output first input data as first sampling data in response to a first enable signal, a first clock, and a second clock;
a second sampling unit configured to output second input data as second sampling data in response to a second enable signal, the second clock, and a third clock;
a third sampling unit configured to output third input data as third sampling data in response to a third enable signal, the third clock, and a fourth clock;
a fourth sampling unit configured to output fourth input data as fourth sampling data in response to a fourth enable signal, the fourth clock, and the first clock; and
an enable signal generation unit configured to generate the first to fourth enable signals in response to the first to fourth clocks,
wherein the second clock has a phase later by ¼ cycle than a phase of the first clock, the third clock has a phase later by ¼ cycle than the phase of the second clock, and the fourth clock has a phase later by ¼ cycle than the phase of the third clock.

11. The semiconductor memory apparatus according to claim 10,
wherein the first sampling unit outputs the first input data as the first sampling data during an enable period of the first enable signal when phases of both the first clock and the second clock are a low level,
wherein the second sampling unit outputs the second input data as the second sampling data during an enable period of the second enable signal when phases of both the second clock and the third clock are a low level,
wherein the third sampling unit outputs the third input data as the third sampling data during an enable period of the third enable signal when phases of both the third clock and the fourth clock are a low level, and
wherein the fourth sampling unit outputs the fourth input data as the fourth sampling data during an enable period of the fourth enable signal when phases of both the fourth clock and the first clock are a low level.

12. The semiconductor memory apparatus according to claim 11, wherein the enable signal generation unit comprises:
a first delay section configured to delay the first clock and generate the first enable signal which has the enable period of a low level during a period in which both the first clock and the second clock are the low level;
a second delay section configured to delay the second clock and generate the second enable signal which has the enable period of a low level during a period in which both the second clock and the third clock are the low level;
a third delay section configured to delay the third clock and generate the third enable signal which has the enable period of a low level during a period in which both the third clock and the fourth clock are the low level; and
a fourth delay section configured to delay the fourth clock and generate the fourth enable signal which has the enable period of a low level during a period in which both the fourth clock and the first clock are the low level.

13. The semiconductor memory apparatus according to claim 11, wherein the enable signal generation unit comprises:
a first signal combining section configured to perform an AND operation on the first and second clocks and generate the first enable signal which has the enable period during a period in which both the first clock and the second clock are the low level;
a second signal combining section configured to perform an AND operation on the second and third clocks and generate the second enable signal which has the enable period during a period in which both the second clock and the third clock are the low level;
a third signal combining section configured to perform an AND operation on the third and fourth clocks and generate the third enable signal which has the enable period during a period in which both the third clock and the fourth clock are the low level; and
a fourth signal combining section configured to perform an AND operation on the fourth and first clocks and generate the fourth enable signal which has the enable period during a period in which both the fourth clock and the first clock are the low level.

14. The semiconductor memory apparatus according to claim 11, wherein the enable signal generation unit comprises:
a first signal combining section configured to perform an OR operation on the first and second clocks and generate the first enable signal which has the enable period during a period in which both the first clock and the second clock are the low level;

a second signal combining section configured to perform an OR operation on the second and third clocks and generate the second enable signal which has the enable period during a period in which both the second clock and the third clock are the low level;

a third signal combining section configured to perform an OR operation on the third and fourth clocks and generate the third enable signal which has the enable period during a period in which both the third clock and the fourth clock are the low level; and a fourth signal combining section configured to perform an OR operation on the fourth and first clocks and generate the fourth enable signal which has the enable period during a period in which both the fourth clock and the first clock are the low level.

15. An electronic device comprising:
a CPU;
random access memory;
an input device;
an output device;
a memory controller; and
a semiconductor memory device including a plurality of sampling units configured to output input data as sampling data in response to respective pairs of clocks of a plurality of clocks and a plurality of enable signals, where each sampling unit is associated with a pair of clocks and an enable signal, and at least one sampling unit from among the plurality of sampling units is configured to be active only when the enable signal is enabled and the pair of clocks are a specified level.

16. The electronic device of claim 15, further comprising an enable signal generation unit configured to be inputted with the plurality of clocks which have different phases, and generate the plurality of enable signals.

17. The electronic device of claim 16, wherein the enable signal generation unit comprises delay sections configured to respectively delay the plurality of clocks and respectively output the plurality of enable signals.

18. The electronic device of claim 17, wherein each of the delay sections are configured to be inputted with a pair of clocks from among the plurality of clocks, and delay at least one of the inputted pair of clocks, and output an enable signal with an enable period that overlaps with a period in which the pair of clocks are a specified level.

19. The electronic device of claim 16, wherein the enable signal generation unit comprises signal combining sections configured to respectively generate the plurality of enable signals, and
wherein each of the signal combining sections are configured to be input with a pair of clocks from among the plurality of clocks, and generate a corresponding enable signal having an enable period that overlaps with a period in which both of the pair of clocks are a specified level.

20. The electronic device of claim 19, wherein each of the signal combining sections generates a corresponding enable signal having an enable period that excludes a period in which both of the pair of clocks are a high level.

* * * * *